United States

O'Neill

4,011,474

Mar. 8, 1977

[54] PIEZOELECTRIC STACK INSULATION

[75] Inventor: Cormac G. O'Neill, Lafayette, Calif.

[73] Assignee: PZ Technology, Inc., San Leandro, Calif.

[22] Filed: Dec. 19, 1975

[21] Appl. No.: 642,309

Related U.S. Application Data

[63] Continuation-in-part of Ser. No. 511,787, Oct. 3, 1974, abandoned.

[52] U.S. Cl. .................. 310/8.7; 310/8.3; 310/9.1
[51] Int. Cl.² .......................... H01L 41/08
[58] Field of Search ........... 310/8, 8.1, 8.2, 8.3, 310/8.6, 8.7, 9.1, 9.4, 9.7, 9.8, 8.9

[56] References Cited

UNITED STATES PATENTS

| | | | |
|---|---|---|---|
| 2,417,426 | 3/1947 | Mason | 310/8.7 |
| 2,498,737 | 2/1950 | Holden | 310/8.7 |
| 2,531,230 | 11/1950 | Mason | 310/8.7 |
| 2,860,265 | 11/1958 | Mason | 310/8.7 |
| 3,396,285 | 8/1968 | Minchenko | 310/8.7 |
| 3,430,080 | 2/1969 | Horan | 310/8.7 |
| 3,466,473 | 9/1969 | Roten | 310/8.7 |
| 3,598,506 | 8/1971 | O'Neill | 310/8 |
| 3,716,828 | 2/1973 | Massa | 310/8.7 X |
| 3,822,388 | 7/1974 | Martini et al. | 310/8.7 X |

*Primary Examiner*—Mark O. Budd
*Attorney, Agent, or Firm*—Lindenberg, Freilich, Wasserman, Rosen & Fernandez

[57] ABSTRACT

By filling the container of a piezoelectric stack with a dielectric fluid under sufficient pressure, or applying sufficient pressure to a solid dielectric, to maintain dielectric particle velocity and piezoelectric particle velocity substantially spaced, dielectric breakdown with consequent arc over and destruction of the piezoelectric stack is prevented.

14 Claims, 6 Drawing Figures

PIEZOELECTRIC STACK INSULATION

CROSS REFERENCE

This application is a continuation-in-part of application Ser. No. 511,787, filed Oct. 3, 1974 now abandoned.

BACKGROUND OF THE INVENTION

This invention relates to a method and means for improving the insulation of a piezoelectric stack and to improvements therein.

In the usual utilization of piezoelectric material, (pz), in devices, piezoelectric discs are stacked. Their opposite flat faces are coated with a conductive material in order to enable voltage to be applied over all of the discs in parallel, while the disc displacement is aggregated as a result of the stacking, to obtain optimum axial displacement for the applied voltage. The piezoelectric stack is usually immersed in an insulating medium in order to prevent arc over between the edges of the discs of the stack.

However, failures are frequently encountered in such assemblies because the dielectric strength of the medium insulating the edges of the conducting layers is limited by the electric field strength rather than by the voltage which is applied. A wide variety of insulating materials with widely different dielectric strengths has been tried without any significant alteration in the breakdown rate. As a result of testing and studies to identify the mechanism whereby breakdown is occurring, it is revealed that there is a separation from the dielectric insulation occurring at the interface between the ceramic disc and the insulating medium.

OBJECT AND SUMMARY OF THE INVENTION

It is an object of this invention to improve the insulation of pz stacks to the extent that breakdowns are avoided.

It is another object of this invention to improve the reliability and life of pz stacks.

Yet another object of the invention is the provision of an improved method and means for insulating a pz stack.

The foregoing and other objects of the invention are achieved by insuring that the insulation used on the pz stack, whether it be fluid or solid, maintains contact at all times with the edges of a pz stack. In the case of an insulating fluid, this is achieved by filling the chamber, in which the pz stack is placed, with an insulating fluid under a sufficiently high pressure. In using solid insulation, by way of example, a coating of a polyurethane may be applied directly to the pz material and maintained in contact by applying fluid pressure or by winding a filament or tape circumferentially over the polyurethane to preload the urethane and insure that it maintains contact with the pz circuits. In all cases the pz stack must be constructed in such a manner that the applied pressure does not cause disc separation or intrusion of solid insulation between discs.

DESCRIPTION OF THE PREFERRED EMBODIMENTS

Figure 1:
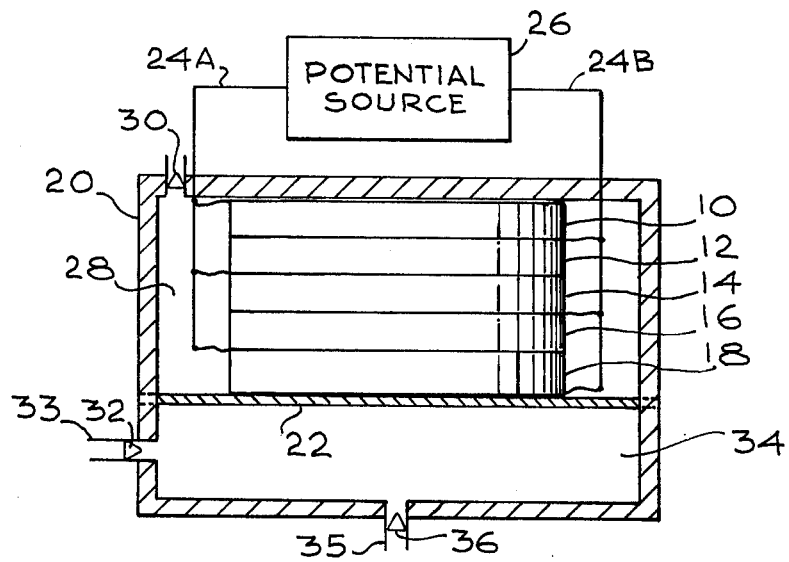
FIG. 1 is a cross sectional view illustrating, by way of example, the pz stack used as a pump.

FIG. 1 illustrates a typical piezoelectric pump. This is to show how the piezoelectric discs are placed together in the stack, and is not to be construed as a limitation upon the invention, since the principles to be described hereunder are applicable to any device which uses a stack of piezoelectric elements which will provide motor forces. By way of illustration, the stack comprises five discs respectively 10, 12, 14, 16, 18. These are enclosed in a chamber having walls 20 on three sides and a movable diaphragm 22 on the fourth side. The disc 10 on one side abuts the top of the chamber and the disc 18 has the diaphragm 22 contacting one face thereof. The discs' flat surfaces are made conductive whereby leads respectively 24A, 24B may be connected to the surfaces of alternate discs by extending them to the conductive surfaces from a potential source 26.

The space 28 between the discs and the walls of the chamber is usually filled with an insulating or dielectric fluid through a filling opening 30. A check valve 32 is usually placed in the intake pipe 33 leading to the pumping chamber 34 of the pump. An outlet check valve 36 is usually placed in the output pipe 35 leading out of the pumping chamber of the pump.

Upon the application of a pulse or voltage from the potential source 36 to the stack of discs, it has been found that the pz material grows or expands in a direction parallel to the electric field provided by the applied voltage but shrinks along axes perpendicular to the electric field. In other words each disc in this stack expands axially and shrinks diametrically. The rate of radial displacement depends upon the rate of axial displacement, which is in turn dependent upon the rise time of the applied voltage, as well as upon the fall time of the applied voltage, and also the mechanical impedance of the axially applied load. Even if the material is fully restrained from axial growth, a radial strain of approximately 20% of the free axial strain will occur.

Investigation of the forces which hold an insulating fluid in contact with the pz stack surfaces reveals the following relationship $$V_p = P/l \, V_s$$

where $V_p$ is the maximum particle velocity that the insulating medium can develop, $V_s$ is the velocity of sound in the insulating medium, $l$ is the density of the insulating medium, and $p$ is the pressure of the insulating medium.

It has been found that when the pz peripheral surface displaces with a velocity greater than $V_p$, cavitation will occur and electrical breakdown will follow if the field applied exceeds the strength of the insulating medium vapor. Even when the surface velocity only approaches $V_p$, a condition can arise where dissolved gas may come out of the solution in the insulating fluid, enabling a breakdown to occur. It is consequently of the greatest importance to retain a considerable margin over the limiting particle velocity.

As previously indicated when a piezoelectric stack of circular discs is energized to create a high strain axial displacement, its circumference contracts simultaneously. The axial displacement is defined as $d_{33} \times E \times L$ and its radial contraction is $d_{31} \times E \times R$.

Where $d_{33}$ is the axial strain coefficient:
$d_{31}$ is the radial strain coefficient
E is the electric field
L is the stack length
R is the stack radius In devices where rapid response is required such as in aerospace valves, control actuators, injection valves, etc. it is necessary to charge a piezoelectric stack in periods approaching 100 usec. Consequently the circumference of the stack tends to displace faster than the fluid can follow and electrical breakdown occurs through voids or pockets of low-pressure vapor formed adjacent to the stack surface.

Consider, for example, a stack of 38 mm diameter driven to provide an axial strain of 0.002, a typical figure for high strain piezoelectric technology in 100 usec. Since $d_{31}$ typically equals 0.5 $d_{33}$, the radial strain is 0.001 giving a surface displacement of 19 × 0.001 mm. This displacement occurs at a velocity of 19.0 cm/sec.

Now solving for $V_p$ in the foregoing equation, the particle velocity that fluid at atmospheric pressure can provide is $$V_p = \sqrt{\frac{1000 \times 981}{0.8 \times 10^5} \frac{gm/cm^2}{gm/cc \cdot cm/sec}}$$

$= 12$ cm/sec
P $= 981$ gm/cm$^2$
Where $\rho$ = insulating fluid density
$= 0.8$ gm/cc
$V_s$ = velocity of sound in insulating fluid $\approx 1000$ m/sec Since 19.0 cm/sec is greater than 12 cm/sec separation (or cavitation) occurs. From the foregoing formula, one can solve for p to determine what pressure is required to be applied to the insulating fluid to increase its particle velocity to equal that of the piezoelectric material.

Unfortunately this situation is aggravated by the enclosure of the insulating fluid in a vessel that carries a piston displaced by the stack. In such a case, there is a net increase in the volume differential between stack and housing created by the reduction in stack diameter.

Some factors which influence this process are fluid pressure, p, a higher pressure giving a higher particle velocity capability; fluid density l, a lower density being desirable; velocity of sound, $V_s$, the lowest value being beneficial; voltage rise time, the longest rise time giving the lowest surface velocity to be equalled or exceeded by $V_p$; stack diameter, a small diameter giving a low $V_p$ requirement; stack strain, a low strain giving a low requirement. From the foregoing it will be appreciated that for a given stack and rate of voltage application, the pressure applied to the dielectric can be varied and by selection of the dielectric itself, the density and the speed of sound therethrough can be varied. If a gas is used, $p/l$ remains constant, but $V_s$ is lower. Consequently improvement can be shown if the dielectric breakdown strength can be held at a high level. Few gases are suitable for this purpose and no benefit can be obtained by pressurization. However, in accordance with this invention use of a given insulating liquid with a hydrostatically applied pressure effects a substantial improvement.

Another factor that must be taken into consideration in determining what pressure should be applied to the insulating fluid to lower the particle velocity of the fluid, is the drop or change in pressure in the fluid, $\delta_p$, caused by the change in volume in the fluid chamber $\delta_r$, caused by the change in radial and axial dimensions of the piezoelectric stack when it is used. This relationship is set forth in the following equation $$\delta_p = (\delta_r K)/V$$

the fluid volume change where $\delta_p$ is the fluid pressure change resulting from $\delta V$, K is the Bulk Modulus of the fluid and V is the original fluid volume. A pressure at least equal to $\delta_p$ should be added to the pressure otherwise used to lower the particle velocity.

Again, taking as an example the previous stack at a length of 100 mm, the net volume change would be 227 mm$^3$ when energized to obtain the normal maximum axial displacement. If the stack is enclosed in a housing 44 mm in side diameter the initial volume is 38.642 mm$^3$. The pressure drop created by the volume increase is therefore:

$\delta P = 13,800 \times \frac{.227}{38.642}$
$= 81.03$ bars.
Where K = insulating oil bulk modules
$= 13,800$ bars
$\delta v$ = volume change = mm$^3$
v = initial volume = mm$^3$ Clearly a pressure drop of this magnitude could not be tolerated without some form of augmentation, since it has been shown that particle velocity is too slow to match the stack surface displacement. The provision of a reservoir coupled to the insulating oil chamber will not provide a response in time to prevent a momentary pressure drop at the very instant that high pressure is needed. The only solution is to provide internal energy in the fluid itself by means of pressurization.

Figure 2:
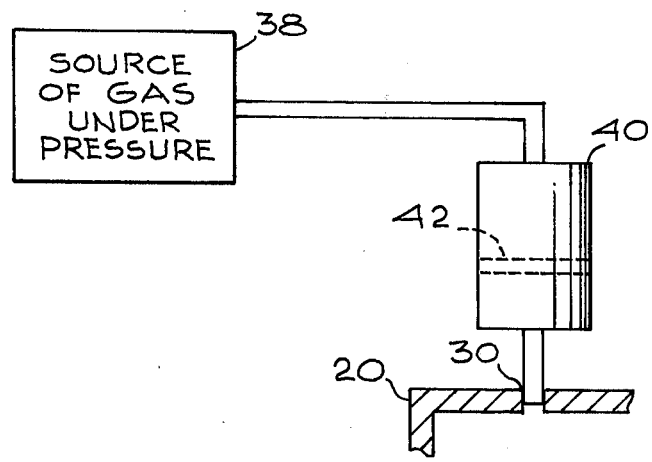
FIG. 2 is a cross sectional fragmented view illustrating one method of insulating the discs of a pz stack, in accordance with this invention.

An arrangement for hydrostatically pressurizing a dielectric fluid used for insulating a piezoelectric stack is schematically illustrated in FIG. 2. It must be understood that in applying pressure gas must not be applied to the dielectric fluid so that there is a gas/liquid interface, since gas dissolves in the fluid and a local drop in pressure can occur adjacent to a stack periphery causing gas to emerge from solution and creating the environment for breakdown. Pressure is applied from a source of either gas or fluid under pressure 38, to a cylinder 40, containing a piston 42. The piston 42 moves down on a portion of the chamber which is filled with the insulating fluid, and which communicates to the stack chamber through the opening 30 in the wall of the chamber 20. A valve, not shown, may be placed in the opening 30, similar, for example, to the type used with automobile tires, to enable the application of pressure by the dielectric fluid in the cylinder 40 to be communicated to the fluid in the housing, as well as to add any additional fluid required to maintain this pressure.

It has been found that good results, as far as insulation and prevention of breakdown, have been achieved by using 120 to 150 psi pressure on a silicone oil dielectric fluid, when fields up to 60 volts per mil are applied to a piezoelectric stack.

It is also important that the insulating or dielectric fluid that is used be degassed. This is done by applying a vacuum to the fluid in the stack chamber, before the application of pressure.

Figure 3:
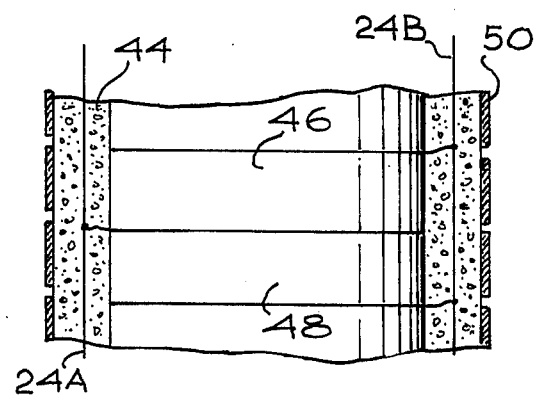
FIG. 3 is a schematic and fragmented view illustrating another arrangement for insulating the discs of a pz stack in accordance with this invention.

Still another arrangement for preventing against breakdown is schematically shown in FIG. 3. Here a flexible solid insulation is used. For example, a coating of polyurethane 44, is applied to the radial surfaces of the discs 46, 48, by way of example. A filament or tape 50, is wound around the polyurethane, to preload the urethane against the ceramic surface and prevent its separation from the piezoelectric disc under stress conditions. The tape is wound leaving small spaces between adjacent wrappings in order to permit room for expansion of the polyurethane.

Figure 4:
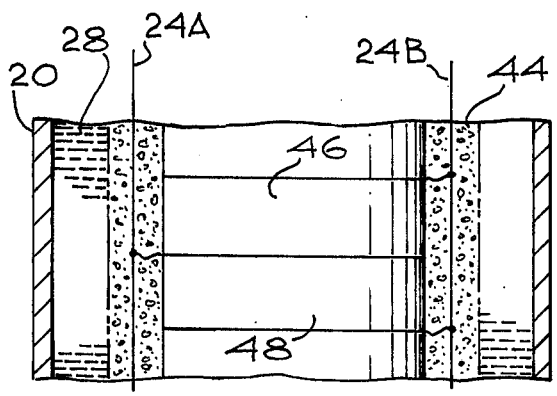
FIG. 4 is a schematic fragmented view illustrating still another embodiment of the invention.

Another arrangement for preventing against breakdown is schematically shown in FIG. 4. Here, the polyurethane coating 44 is applied to the radial surfaces of the illustrative discs 46, 48, as before. However instead of winding a tape around the polyurethane, the cavity 28 is filled with a dielectric fluid under pressure. This will accomplish the purpose desired of maintaining the insulation in contact with the radial surfaces of the piezoelectric discs for all conditions of use.

Figure 5:
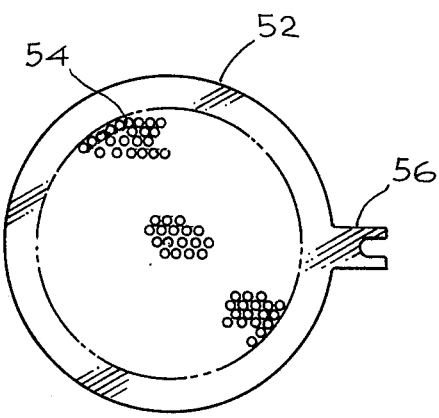
FIG. 5 is a drawing of a disc used between pz discs.

It is important, for proper operation, that the discs of a pz stack be maintained in electrical contact with each other, and no intrusion between pz discs by the dielectric with consequent disc separation should be permitted to occur despite the application of pressure to the dielectric to maintain its particle velocity on the order of the particle velocity of the pz material. One way of preventing intrusion would be to bond the pz discs to one another, but doing this and maintaining good electrical contact provides a problem. A preferred method of constructing a pz stack which maintains the discs in electrical contact and yet prevents dielectric intrusion between discs which can cause operation is, after the opposing races of the discs have been plated with a conductive metal layer, a metal disc is placed between each of the opposing pz disc. This metal disc is on the order of 0.002 inch thick, and, as shown in FIG. 5, comprises an outer ring 52, which, by way of example, is about 2mm wide and a foraminate center 54 in which the holes are less than 1 mm in diameter. A tab 56, is provided on the outer ring, which extends from between the pz discs to afford electrical connection to the disc faces.

An insulating epoxy coating is applied between the discs and around the outsides of the discs. A vacuum and a backfeed of epoxy is applied to insure overall coating. Then, pressure is applied to opposite ends of the stack of discs to squeeze out the excess epoxy from between the discs and to insure metallic contact between discs and pz. The epoxy is cured in this state.

Figure 6:
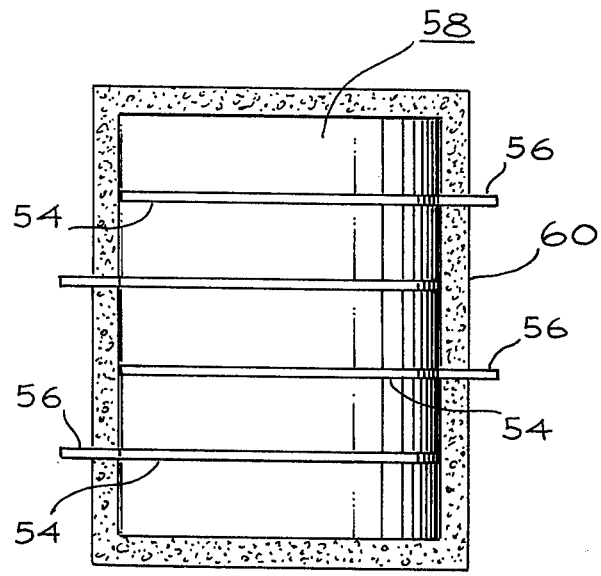
FIG. 6 is a drawing of an improved pz stack, in accordance with this invention.

The result obtained is shown in FIG. 6. The stack of discs 58 is completely encased in epoxy 60. The discs of the stack are also firmly bonded together by the many columns of epoxy which extend between discs through the openings 54 in the metal disc centers. The tabs 56 on the discs extend through the epoxy encasing to afford external connection to the pz disc faces.

It has been found that because of the method of bonding together the surfaces of adjacent discs and because of the effective encasing of the pz stack in an epoxy tube, the problem of intrusion between adjacent discs occuring because of the pressure applied to the epoxy by another dielectric, in the manner previously described for maintaining the epoxy particle velocity on the order of the pz particle velocity has been eliminated.

One of the unexpected dividends obtained by the interface disc bonding in the manner described, is that the Young's Modulus of the stack is increased substantially over what it otherwise is. It appears that while the Young's Modulus of the epoxy is quite low and normally reduces that of the stack considerably, by hydrostatically containing the epoxy in the holes in the disc, the Young's Modulus is raised considerably and as a result the energy available from the stack is increased, as is to be expected by the increased Young's Modulus.

There has been accordingly described and shown here a novel and useful arrangement for improving the insulation used for pz stack to prevent dielectric breakdown.

What is claimed is:

1. In apparatus of the type employing a plurality of piezoelectric discs having flat surfaces which are stacked serially, which have a dielectric medium applied to their radial surfaces, and which have a voltage applied to the opposing surfaces of said discs for the purpose of causing them to change their radial dimension in response thereto, said voltage having a rise time or fall time such that the particle velocity of the piezoelectric material exceeds the particle velocity of said dielectric medium when said voltage is applied resulting in a separation therebetween, the improvement comprising applying pressure continuously to said dielectric medium to increase its particle velocity to a value at which it will compensate for separation caused by the difference between its particle velocity and the particle velocity of said piezoelectric material to maintain said dielectric medium in contact with said piezoelectric material during the application of said voltage.

2. In apparatus of the type as recited in claim 1 including inserting a metal disc having a plurality of holes between opposite faces of each pair of piezoelectric discs to maintain electrical contact therebetween, bonding each of said pairs of piezoelectric discs together with the material of said dielectric medium through the plurality of holes in each of said metal discs, and coating the remaining exposed surfaces of said discs with the material of said dielectric medium.

3. In apparatus as recited in claim 2 wherein said dielectric medium is a solid material and said step of applying pressure thereto to maintain it in contact with the radial surfaces of said stack of piezoelectric material comprises the step of wrapping another dielectric medium around said dielectric material which is in contact with said piezoelectric radial surfaces with sufficient pressure to increase the particle velocity of said dielectric medium.

4. An apparatus as recited in claim 1 wherein the step of applying pressure to said dielectric material, includes, applying a dielectric fluid under pressure to the dielectric coated surfaces of said piezoelectric stack.

5. In apparatus employing a plurality of piezoelectric discs arranged serially in a stack and wherein said discs are in a chamber filled with an insulating fluid, and there are means for applying a voltage to opposite faces of the discs of said stack to achieve axial dimensional changes, said voltage having a rise time or fall time such that the particle velocity of the piezoelectric material exceeds the particle velocity of said insulating fluid when said voltage is applied resulting in a separation therebetween, the improvement comprising means for continuously pressurizing said insulating fluid in said chamber to a value which increases its particle velocity to compensate for separation caused by the difference between its particle velocity and the particle velocity of said piezoelectric material during the application of said voltage.

6. Apparatus as recited in claim 5 wherein said means for pressurizing said insulated fluid comprises a cylinder having a piston therein defining the first space on one side thereof and a second space on the opposite side thereof, a dielectric fluid filling said first space, said first space being in communication with the dielectric fluid within which said piezoelectric stack is immersed, and means for applying pressure to said piston from said second space to pressurize the fluid in said first space as well as to the fluid in which said piezoelectric stack is immersed.

7. In apparatus of the type employing a plurality of piezoelectric disc having conductive flat surfaces which are stacked serially, and which have a voltage applied to the opposing surfaces of said discs for the purpose of causing them to change their radial dimension in response thereto, said voltage having a rise and/or fall time such that the particle velocity of the piezoelectric material exceeds the particle velocity of said dielectric medium when said voltage is applied, resulting in a separation therebetween, the improvement comprising inserting a metal disc having a plurality of holes between opposite faces of each pair of piezoelectric discs, bonding each of said pairs of piezoelectric discs together with a dielectric material through the holes in the metal disc between each pair of piezoelectric discs, encasing said plurality of piezoelectric discs in said dielectric material, and continuously applying pressure to said dielectric material encasing said plurality of piezoelectric discs to increase its particle velocity to a value at which it will substantially equal the particle velocity of said piezoelectric material during the application of said voltage.

8. In apparatus employing a stack of piezoelectric discs having conductive flat surfaces, which discs are arranged serially in a stack, and have a dielectric coating applied to their edges and wherein a voltage is applied to opposite surfaces of said discs causing them to change their radial dimensions in response thereto, means for preventing destructive arcing across discs caused by the particle velocity of said piezoelectric discs exceeding the particle velocity of said dielectric coating upon the application of said voltage comprising means for applying sufficient pressure to said dielectric coating to increase its particle velocity to a value at which it will maintain contact with said piezoelectric material during the application of said voltage.

9. In apparatus as recited in claim 8 wherein there is included a metal disc between each pair of piezoelectric discs, each said disc having a plurality of holes therethrough, and dielectric means bonding together each pair of piezoelectric disc through the holes in each of said metal discs.

10. In apparatus employing a stack of piezoelectric discs having conductive flat surfaces, which discs are arranged serially in a stack, wherein a voltage is applied to opposite surfaces of said discs causing them to change their radial dimensions in response thereto, means for preventing destructive arcing across said discs, comprising a metal disc inserted between each pair of piezoelectric discs, first dielectric means bonding together each pair of piezoelectric discs through the holes in each of said metal discs and covering the remaining surfaces of said piezoelectric discs, and second dielectric means for continuously applying sufficient pressure to said first dielectric means to maintain its particle velocity at a value whereby said first dielectric means will remain in contact with said piezoelectric discs during the rise and fall time of the voltage applied thereto.

11. In apparatus as recited in claim 10 wherein each said metal disc comprises an outer flat metal ring enclosing a foraminate region, and a tag extending from said ring to afford electrical connection thereto.

12. In apparatus of the type employing a plurality of piezoelectric discs having flat surfaces which are stacked serially, which have a dielectric medium applied to their radial surfaces, and which have a voltage applied to the opposing surfaces of said discs for the purpose of causing them to change their radial dimension in response thereto, said voltage having a rise time or fall time such that the particle velocity of the piezoelectric material exceeds the particle velocity of said dielectric medium when said voltage is applied resulting in a separation therebetween, the method of preventing said separation comprising determining the particle velocity of said piezoelectric material upon the application of said voltage thereto, determining the pressure drop caused in said dielectric medium caused by the change in volume of said piezoelectric stack by the applied voltage, determining the pressure that has to be applied to said dielectric medium to cause it to have substantially the same particle velocity as said piezoelectric material upon the application of said voltage, and applying a pressure to said dielectric medium at least equal to the sum of said determined pressure drop and said determined pressure that has to be applied to said dielectric medium.

13. In apparatus of the type employing a plurality of piezoelectric discs having flat surfaces which are stacked serially, which have a pressurized dielectric medium applied to their radial surfaces, and which have a voltage applied to the opposing surfaces of said discs for the purpose of causing them to change their radial dimension in response thereto, whereby a drop in the pressure of said pressurized dielectric occurs, said voltage having a rise time or fall time such that the particle velocity of the piezoelectric material in response thereto and as a result of said pressure drop exceeds the particle velocity of said dielectric medium when said voltage is applied resulting in a separation therebetween, the method of preventing said separation comprising applying additional pressure continuously to said dielectric medium to increase the particle velocity of said dielectric medium to a value at which it will compensate for separation caused by the difference between its particle velocity and the particle velocity of said piezoelectric material to maintain said dielectric medium in contact with said piezoelectric material during the application of said voltage.

14. In apparatus employing a plurality of piezoelectric discs arranged serially in a stack and wherein said discs are in a chamber filled with a pressurized insulating fluid, and there are means for applying a voltage to opposite faces of the discs of said stack to achieve axial dimensional changes resulting in a drop in the pressure applied by said pressurized insulating fluid, said voltage having a rise time or fall time such that the particle velocity of the piezoelectric material in response thereto and also as a result of said pressure drop exceeds the particle velocity of said insulating fluid when said voltage is applied resulting in a separation therebetween, the improvement comprising means for increasing the particle velocity of said insulating fluid in said chamber to a value which compensates for separation caused by the difference to its particle velocity from the particle velocity of said piezoelectric material during the application of said voltage.

* * * * *